(12) United States Patent
Pan et al.

(10) Patent No.: US 12,418,274 B2
(45) Date of Patent: Sep. 16, 2025

(54) DUAL-MODE SURFACE ACOUSTIC WAVE DEVICE AND PREPARATION METHOD THEREOF

(71) Applicant: SUZHOU DABO NEW MATERIAL TECHNOLOGY CO., LTD., Suzhou (CN)

(72) Inventors: Feng Pan, Suzhou (CN); Huiping Xu, Suzhou (CN); Rui Wang, Suzhou (CN); Mengxuan Qian, Suzhou (CN)

(73) Assignee: SUZHOU DABO NEW MATERIAL TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 18/994,642

(22) PCT Filed: Aug. 26, 2024

(86) PCT No.: PCT/CN2024/114533
§ 371 (c)(1),
(2) Date: Jan. 15, 2025

(87) PCT Pub. No.: WO2025/145626
PCT Pub. Date: Jul. 10, 2025

(65) Prior Publication Data
US 2025/0266809 A1    Aug. 21, 2025

(30) Foreign Application Priority Data
Jan. 4, 2024 (CN) .......................... 202410009274.0

(51) Int. Cl.
*H03H 9/25* (2006.01)
*H03H 3/08* (2006.01)

(52) U.S. Cl.
CPC ................ *H03H 9/25* (2013.01); *H03H 3/08* (2013.01)

(58) Field of Classification Search
CPC .................................. H03H 9/25; H03H 9/64
See application file for complete search history.

(56) References Cited

U.S. PATENT DOCUMENTS

| 8,436,509 B1 | 5/2013 | Branch et al. |
| 8,710,713 B2 * | 4/2014 | Kando ............... H03H 9/14538 |
| | | 310/313 B |

(Continued)

FOREIGN PATENT DOCUMENTS

| CN | 104198963 A | 12/2014 |
| CN | 105993129 A | 10/2016 |

(Continued)

*Primary Examiner* — Andrea Lindgren Baltzell
*Assistant Examiner* — Alan Wong
(74) *Attorney, Agent, or Firm* — Bayramoglu Law Offices LLC (57) ABSTRACT

A dual-mode surface acoustic wave device and a preparation method thereof are provided. The dual-mode surface acoustic wave device includes a substrate, a piezoelectric layer and an interdigital electrode which are successively stacked in a selected direction. The thickness of the interdigital electrode is 10 nm-5 μm to excite a first-order horizontal shear wave mode, so that the dual-mode surface acoustic wave device has two acoustic wave modes, namely, a ground state horizontal shear wave and a first-order horizontal shear wave. The dual-mode surface acoustic wave device with two acoustic wave modes, namely, the ground state horizontal shear wave and the first-order horizontal shear wave can be prepared, so that the dual-mode surface acoustic wave device can support a filtering function in more frequency bands in 5G communication, and meets the development trend of miniaturization and broadband of surface acoustic wave filters.

20 Claims, 9 Drawing Sheets

(56) References Cited

U.S. PATENT DOCUMENTS

| | | | |
|---|---|---|---|
| 10,454,179 B1 | 10/2019 | Kabakian et al. | |
| 10,454,448 B2 * | 10/2019 | Kimura | H03H 9/02834 |
| 11,177,787 B2 * | 11/2021 | Caron | H03H 9/02574 |
| 11,942,920 B2 * | 3/2024 | Lu | H03H 9/175 |
| 2016/0352304 A1 | 12/2016 | Kadota et al. | |

FOREIGN PATENT DOCUMENTS

| | | |
|---|---|---|
| CN | 108449068 A | 8/2018 |
| CN | 111817678 A | 10/2020 |
| CN | 112713873 A | 4/2021 |
| CN | 113328723 A | 8/2021 |
| CN | 114124023 A | 3/2022 |
| CN | 115425942 A | 12/2022 |
| CN | 116599491 A | 8/2023 |
| CN | 116781033 A | 9/2023 |
| CN | 117013984 A | 11/2023 |
| CN | 117526897 A | 2/2024 |
| JP | H08250969 A | 9/1996 |
| JP | H11220378 A | 8/1999 |
| WO | 2022184118 A1 | 9/2022 |

\* cited by examiner

DUAL-MODE SURFACE ACOUSTIC WAVE DEVICE AND PREPARATION METHOD THEREOF

CROSS-REFERENCE TO THE RELATED APPLICATIONS

This application is the national phase entry of International Application No. PCT/CN2024/114533, filed on Aug. 26, 2024, which is based upon and claims priority to Chinese Patent Application No. 202410009274.0, filed on Jan. 4, 2024, the entire contents of which are incorporated herein by reference.

TECHNICAL FIELD

The present disclosure relates to the technical field of electronic information, and particularly to a dual-mode surface acoustic wave device and a preparation method thereof.

BACKGROUND

Various mobile terminal devices, represented by smart phones, have achieved richer functions in continuous upgrading of a mobile communication technology, which greatly facilitates people's lives. However, the transmission volume of data exhibits explosive growth with the continuous increase in the number of mobile terminal devices. In order to ensure that the transmission rate of data is not affected, the number of filters in a new-generation mobile communication technology must also correspondingly increase. Meanwhile, the mobile terminal devices (such as mobile phones) also have the requirement on portability, and an increase in the number of filters will inevitably lead to an increase in volume. Therefore, the miniaturization of the filter is one of the technical problems in the field of radio frequency.

A majority of the filters in radio-frequency front end modules of the mobile phones are surface acoustic wave filters which are composed of piezoelectric materials and metal interdigital transducer electrode materials. In the radio-frequency front end module, the filter needs to complete signal separation and selection functions of multiple discrete frequency bands, the traditional filter generally has one passband, i.e., specific passband frequency response feature, an increase in the bandwidth of the passband can make it support more frequency bands, thereby reducing the number of the filters; in addition, a multi-passband filter based on a multi-mode resonator can use one filter to achieve filtering mission that is completed by multiple single-passband filters. Therefore, the integration of multi-passband filters is an effective method to reduce the size and number of electronic devices in the radio-frequency front end module.

SUMMARY

The main objective of the present disclosure is to provide a dual-mode surface acoustic wave device and a preparation method thereof, thereby overcoming the defects in the prior art.

In order to achieve the foregoing objective of the present disclosure, the technical solution adopted by the present disclosure includes:

One aspect of the present disclosure provides a dual-mode surface acoustic wave device, comprising a substrate, a piezoelectric layer and an interdigital electrode which are successively stacked in a selected direction, wherein the thickness of the interdigital electrode is 10 nm-5 µm, preferably 0.1 µm-4 µm, to excite a first-order horizontal shear wave mode, so that the dual-mode surface acoustic wave device has two acoustic wave modes, namely, a ground state horizontal shear wave mode and the first-order horizontal shear wave mode. For example, the thickness of the interdigital electrode can be 10 nm, 30 nm, 50 nm, 0.1 µm, 0.6 µm, 1 µm, 2 µm, 3 µm, 4 µm, 5 µm, etc.

Further, the wavelength of the interdigital electrode is 0.4 µm-20 µm, preferably 0.8 µm-8 µm, such as 0.4 µm, 0.5 µm, 0.8 µm, 1 µm, 1.5 µm, 2 µm, 2.2 µm, 3 µm, 3.8 µm, 4 µm, 5 µm, 6 µm, 8 µm, 10 µm, 13 µm, 15 µm, 19 µm, 20 µm, etc.

Further, the width of the interdigital electrode is 0.1 µm-5 µm, preferably 0.2 µm-2 µm, such as 0.1 µm, 0.2 µm, 0.6 µm, 1µ, 1.5 µm, 2 µm, 2.2µ, 3 µm, 3.8 µm, 4 µm, 5 µm, etc.

Further, the thickness-to-wavelength ratio of the interdigital electrode is 0.09-0.4.

Further, the material of the interdigital electrode is a metal with a density of more than 2700 kg/m$^3$.

Further, the material of the interdigital electrode is Al, and the thickness-to-wavelength ratio of the interdigital electrode is 0.17-0.4; or, the material of the interdigital electrode is Cu, and the thickness-to-wavelength ratio of the interdigital electrode is 0.12-0.3; or, the material of the interdigital electrode is Mo, and the thickness-to-wavelength ratio of the interdigital electrode is 0.2-0.3; or, the material of the interdigital electrode is W, and the thickness-to-wavelength ratio of the interdigital electrode is 0.15-0.3; or, the material of the interdigital electrode is Pt, and the thickness-to-wavelength ratio of the interdigital electrode is 0.09-0.28.

In some particular embodiments, the dual-mode surface acoustic wave device also comprises at least one functional layer which is arranged between the piezoelectric layer and the substrate.

Further, the material of the functional layer comprises at least one of silicon oxide, aluminum oxide, aluminum nitride, silicon nitride, hafnium oxide, zirconium oxide, titanium oxide and polycrystalline silicon, but is not limited thereto.

Further, the thickness of the functional layer is 0.1 µm-10 µm, preferably 0.1 µm-1 µm.

In some particular embodiments, the dual-mode surface acoustic wave device comprises at least two functional layers which are successively stacked, and the materials of the at least two functional layers are different.

Further, the piezoelectric layer comprises a rotating Y-cut LiTaO$_3$ single crystal film or a rotating Y-cut LiNbO$_3$ single crystal film.

Further, the thickness of the piezoelectric layer is 0.2 µm-5 µm.

Further, the surface roughness of the piezoelectric layer is less than 1 nm.

Further, the transverse wave sound velocity of the substrate is more than 4200 m/s.

Further, the substrate is a single crystal support substrate. Specifically, the substrate can be any one of a quartz underlying substrate, a silicon underlying substrate, a sapphire underlying substrate, a diamond underlying substrate or a silicon carbide underlying substrate, but is not limited thereto. The transverse wave sound velocity of the quartz underlying substrate is more than 4200 m/s.

Further, the thickness of the substrate is 200 µm-1000 µm, preferably 250 µm-500 µm.

Further, a buffer layer is also arranged between the interdigital electrode and the piezoelectric layer, and the material of the buffer layer comprises at least one of titanium, nickel, chromium and zirconium, but is not limited thereto.

Further, the thickness of the buffer layer is 1 nm-20 nm.

Further, the electromechanical coupling coefficient of the ground state horizontal shear wave of the dual-mode surface acoustic wave device is more than 15%, and the electromechanical coupling coefficient of the first-order horizontal shear wave of the dual-mode surface acoustic wave device is more than 10%.

Further, the dual-mode surface acoustic wave device can be a dual-mode surface acoustic wave resonator.

The present disclosure also provides a preparation method of a dual-mode surface acoustic wave device, comprising:

providing a substrate;

preparing a piezoelectric layer on the substrate;

preparing an interdigital electrode on the piezoelectric layer;

wherein the thickness of the interdigital electrode is 10 nm-5 μm, preferably 0.1 μm-4 μm, to excite a first-order horizontal shear wave mode, so that the dual-mode surface acoustic wave device has two acoustic wave modes, namely, a ground state horizontal shear wave mode and the first-order horizontal shear wave mode. For example, the thickness of the interdigital electrode can be 10 nm, 30 nm, 50 nm, 0.1 μm, 0.6 μm, 1 μm, 2 μm, 3 μm, 4 μm, 5 μm, etc.

Further, the width of the interdigital electrode is 0.1 μm-5 μm, preferably 0.2 μm-2 μm, such as 0.1 μm, 0.2 μm, 0.6 μm, 1μ, 1.5 μm, 2 μm, 2.2 μm, 3 μm, 3.8 μm, 4μ, 5 μm, etc.

Further, the wavelength of the interdigital electrode is 0.4 μm-20 μm, preferably 0.8 μm-8 μm, such as 0.4 μm, 0.5 μm, 0.8 μm, 1 μm, 1.5 μm, 2 μm, 2.2 μm, 3 μm, 3.8 μm, 4 μm, 5 μm, 6 μm, 8 μm, 10 μm, 13 μm, 15 μm, 19 μm, 20 μm, etc.

Further, the thickness-to-wavelength ratio of the interdigital electrode is 0.09-0.4.

Further, the material of the interdigital electrode is a metal with a density of more than 2700 kg/m$^3$.

Further, the material of the interdigital electrode is Al, and the thickness-to-wavelength ratio of the interdigital electrode is 0.17-0.4; or, the material of the interdigital electrode is Cu, and the thickness-to-wavelength ratio of the interdigital electrode is 0.12-0.3; or, the material of the interdigital electrode is Mo, and the thickness-to-wavelength ratio of the interdigital electrode is 0.2-0.3; or, the material of the interdigital electrode is W, and the thickness-to-wavelength ratio of the interdigital electrode is 0.15-0.3; or, the material of the interdigital electrode is Pt, and the thickness-to-wavelength ratio of the interdigital electrode is 0.09-0.28.

In some particular embodiments, the preparation method can specifically comprise:

performing ion implantation on one polishing surface of the piezoelectric layer to form an ion implantation layer inside the piezoelectric layer; fitting the substrate with the polishing surface of the piezoelectric layer; and then bonding the fit substrate to the piezoelectric layer so as to form a composite underlying substrate;

annealing the composite underlying substrate, and stripping the ion implantation layer along the piezoelectric layer, then grinding and polishing the surface of the stripped piezoelectric layer far away from the substrate by using a polishing method (such as chemical mechanical polishing), and thinning to the required thickness; and finally forming an interdigital electrode on the surface of the piezoelectric layer of the composite underlying substrate far away from the substrate.

Further, the ion implantation temperature is 50-100° C., the ion implantation energy is 1-2500 keV, and the implantation dose is $1\times10^{15}$-$9\times10^{17}$ cm$^{-1}$.

Further, when the fit substrate is bonded to the piezoelectric layer to form the composite underlying substrate, the bonding temperature adopted is 20-250° C., and the bonding pressure is 100-1000 N, preferably 600-1000 N.

Further, the above preparation method specifically comprises: annealing the composite underlying substrate at 50-900° C. for 10 min to 100 h so that the piezoelectric layer is stripped along the ion implantation layer.

In another particular embodiments, the above preparation method also specifically comprises: bonding the substrate to the piezoelectric layer by using a direct bonding method to form the composite underlying substrate, wherein the composite underlying substrate has two acoustic wave modes, namely, the ground state horizontal shear wave mode and the first-order horizontal shear wave mode, and then preparing the interdigital electrode on the piezoelectric layer.

Further, the above preparation method specifically comprises: directly bonding the substrate to the piezoelectric layer under the conditions that the vacuum degree is less than 10-4 Pa, the bonding temperature is 20-250° C. and the bonding pressure is 600-1000 N to form the composite underlying substrate; annealing the composite underlying substrate at 200-300° C. for 5-10 h to enhance a bonding force; and polishing the thickness of the piezoelectric layer before and after annealing to the required thickness.

Further, the above preparation method specifically comprises: preparing an electrode film on the piezoelectric layer by using an electron beam evaporation method or a magnetron sputtering method or the like, and then patterning the electrode film by using a photoetching lift-off method, an etching method or a mask coating method or the like, so as to form the interdigital electrode.

Further, before the composite underlying substrate is prepared, the above preparation method also comprises: washing the piezoelectric layer and the substrate. The washing step is as follows: respectively performing ultrasonic washing for 4-8 min using acetone, alcohol and deionized water in turn and then blowing to be dry using nitrogen.

Further, the dual-mode surface acoustic wave device also comprises a functional layer. The above preparation method can specifically comprise: performing ion implantation on the polishing surface of the piezoelectric layer and successively stacking the piezoelectric layer, the functional layer and the substrate so that the functional layer is located between the piezoelectric layer and the substrate, and the functional layer fits with the polishing surface of the piezoelectric layer; and then bonding the fit piezoelectric layer, the functional layer and the substrate to form the composite underlying substrate.

Further, the above preparation method can specifically comprise: forming the functional layer on the piezoelectric layer by using a film preparation method such as a chemical vapor deposition method, a physical vapor deposition method or a sol-gel method.

Compared with the prior art, the present disclosure has the advantages:

1) The dual-mode surface acoustic wave device provided in the present disclosure enhances the excitation of the SH1 mode by increasing the thickness of the electrode, and the SH1 mode forms a dual-mode surface acoustic wave resonator and filter together with the SH0 mode. Furthermore, the electromechanical coupling coefficients of the two acoustic wave modes are both relatively large, the electromechanical coupling coefficient of the SH0 mode is up to more than 15% and the electromechanical coupling coefficient of the SH1 mode is up to more than 10%. Therefore, the dual-mode surface acoustic wave device provided in the present disclosure can support filtering in more frequency bands in 5G communication, and meets the development trend of miniaturization and broadband of the surface acoustic wave filter.

2) In the dual-mode surface acoustic wave device provided in the present disclosure, the functional layer is arranged between the piezoelectric layer and the substrate, which promotes the temperature stability of the device, reduces the temperature drift, increases the effective resistance of the substrate and improves the Q value of the device; in addition, the material of the functional layer can be silicon dioxide and aluminum nitride, the characteristics that silicon dioxide is low in acoustic velocity and the aluminum nitride is high in acoustic velocity can form a waveguide structure, thereby further promoting the acoustic energy limiting effect of the device and reducing the energy loss of the device.

3) The preparation method of the dual-mode surface acoustic wave device provided in the present disclosure utilizes the bonding process to bond the rotating Y-cut LiTaO$_3$ or rotating Y-cut LiNbO$_3$ single crystal film to the substrate to form the composite piezoelectric underlying substrate, thereby inhibiting the leakage of the leaky surface acoustic wave (LSAW) and promoting the acoustic wave energy limiting effect of the substrate so that main resonance is transformed into a non-leaky SH0 mode, and the electromechanical coupling coefficient can be up to more than 15%.

DETAILED DESCRIPTION OF THE EMBODIMENTS

In view of the defects in the prior art, the inventor of this case proposes the technical solution of the present disclosure via long-term researches and lots of practices. Next, the technical solution, implementation process and principle and the like will be further explained and illustrated through particular embodiments. However, embodiments are only for explaining the present disclosure but not limiting thereto. Unless otherwise specified, the film preparation process, patterning process, annealing process, bonding and corresponding equipment used in this application are known to those skilled in the art. The experimental methods used in the following embodiments are conventional methods unless otherwise specified. The materials, reagents, etc. used in the following embodiments can be obtained from commercial sources unless otherwise specified.

Via researches, the applicant of this case has found that the bandwidth of an acoustic filter is proportional to the electromechanical coupling coefficient of the corresponding resonator. The leakage wave mode in rotating Y-cut lithium niobate (LiNbO$_3$) has the characteristic of a large electromechanical coupling coefficient. Based on the study of a composite underlying substrate of piezoelectric single crystal films lithium tantalate (LiTaO$_3$) and LiNbO$_3$ and a high speed substrate, it has been found that high speed substrates are conducive to reducing leakage of leakage waves, making it a non leaking horizontal shear wave (SH0) mode with an electromechanical coupling coefficient of over 15%; at the same time, there is a first-order horizontal shear wave (SH1) mode in this structure, which can be enhanced and excited by increasing the electrode thickness, making its electromechanical coupling coefficient exceed 10%. Therefore, this structure can be used to prepare dual-mode resonators, meeting the needs of large bandwidth and miniaturization of filters in the 5G era.

Specifically, the calculation formula of the electrochemical coupling coefficient $K^2$ in embodiments is as follows:

$$K^2 = (\pi/2) \times (f_s/f_p)/\tan[(\pi/2) \times (f_s/f_p)] \qquad (1)$$

Wherein $f_s$ is a resonant frequency, $f_p$ is an anti-resonance frequency, both of them respectively are frequencies corresponding to the highest and lowest points of the resonant signal of interest in the admittance curve of the resonator.

The calculation formula of phase velocity $v_p$ is as follows:

$$v_p = (f_s + f_p) \times \lambda/2 \qquad (2)$$

It is noted that the phase velocity refers to description of a sound velocity of an acoustic wave mode in a resonator, with a wide range of sound velocity including intrinsic properties of a material.

Figure 1:
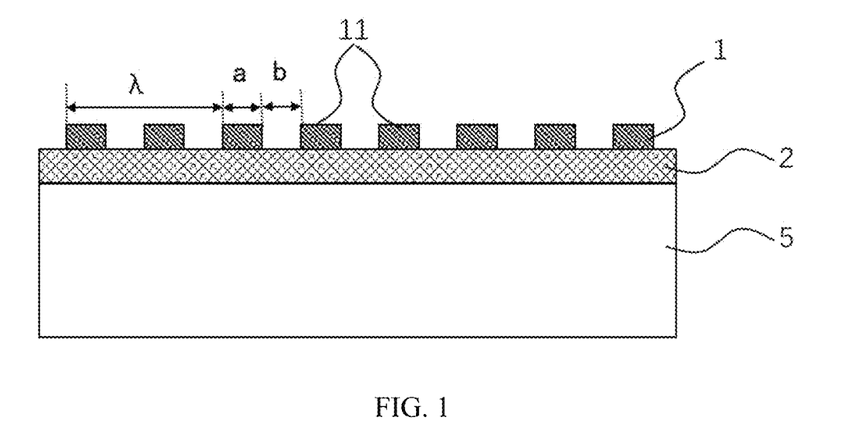
FIG. 1 is a structural diagram of a dual-mode surface acoustic wave device provided in the present disclosure.

Referring to FIG. 1, which is a structural diagram of a dual-mode surface acoustic wave device provided in the present disclosure. The dual-mode surface acoustic wave device simultaneously has two acoustic wave modes with large electromechanical coefficients. The dual-mode surface acoustic wave device comprises a substrate 5, a piezoelectric layer 2 and an interdigital electrode 1 which are successively stacked in a selected direction. The thickness-to-wavelength ratio (h/λ) of the interdigital electrode 1 is 0.09-0.4. The selected direction is a longitudinal direction or thickness direction of the dual-mode surface acoustic wave device. The dual-mode surface acoustic wave device can be the dual-mode surface acoustic wave resonator. The dual-mode surface acoustic wave resonator can be prepared into the dual-mode surface acoustic wave filter. The dual-mode surface acoustic wave filter comprises at least one dual-mode surface acoustic wave resonator.

The interdigital electrode 1 comprises multiple spaced finger portions 11. The shapes and sizes of the multiple finger portions 11 are all the same. The thickness h of each finger portion 11 is the thickness of the interdigital electrode. The wavelength of the interdigital electrode is λ=2a+2b, wherein a is the width of each finger portion 11, and b is a distance between two adjacent finger portions 11. It can be understood that the width of the finger portion 11 and the distance between two adjacent finger portions 11 are all sizes along the radial direction of the finger portion 11, and the radial direction of the finger portion 11 is vertical to the selected direction.

In a structure of interdigital electrode 1/piezoelectric layer 2/substrate 5 based on a horizontal shear wave (SH wave) as a main mode, generally, a ground state horizontal shear wave mode and a first-order horizontal shear wave mode are present simultaneously, however, the first-order horizontal shear wave mode is generally known as a spurious mode since it cannot be fully excited. In the present disclosure, the thickness-to-wavelength ratio of the interdigital electrode 1 reaches a specific range by directly regulating the material and thickness of the interdigital electrode 1, and the change in the sound velocity and electromechanical coefficient of the first-order horizontal shear wave mode achieves simultaneous and effective excitation of two modes, thereby obtaining the dual-mode surface acoustic wave device.

The material of the interdigital electrode 1 is a metal with a density of more than 2700 kg/m$^3$, for example, the material of the interdigital electrode 1 can be aluminum (Al), copper (Cu), molybdenum (Mo), tungsten (W), platinum (Pt), etc, wherein the density of Al is 2700 kg/m$^3$, the horizontal shear modulus is 26 GPa, and the shear wave acoustic impedance is 8.4 Pa$^6$·s/m$^3$; the density of Cu is 8960 kg/m$^3$, the horizontal shear modulus is 45 GPa, and the shear wave acoustic impedance is 20 Pa$^6$·s/m$^3$; the density of Mo is 10200 kg/m$^3$, the horizontal shear modulus is 119 GPa, and the shear wave acoustic impedance is 34.9 Pa$^6$·s/m$^3$; the density of Pt is 21450 kg/m$^3$, the horizontal shear modulus is 61 GPa, and the shear wave acoustic impedance is 36.2 Pa$^6$·s/m$^3$; the density of W is 19350 kg/m$^3$, the horizontal shear modulus is 161 GPa, and the shear wave acoustic impedance is 55.7 Pa$^6$·s/m$^3$.

In one particular embodiment, the material of the interdigital electrode 1 is Al, and the thickness-to-wavelength ratio of the interdigital electrode 1 is 0.17-0.4; or, the material of the interdigital electrode 1 is Cu, and the thickness-to-wavelength ratio of the interdigital electrode 1 is 0.12-0.3, such as 0.12, 0.13, 0.15, 0.18, 0.2, 0.21, 0.25, 0.27, 0.29, 0.3, etc.; or, the material of the interdigital electrode 1 is Mo, and the thickness-to-wavelength ratio of the interdigital electrode 1 is 0.2-0.3, such as 0.21, 0.22, 0.23, 0.25, 0.26, 0.28, 0.3, etc.; or, the material of the interdigital electrode 1 is W, and the thickness-to-wavelength ratio of the interdigital electrode 1 is 0.15-0.3, such as 0.15, 0.16, 0.17, 0.19, 0.2, 0.21, 0.23, 0.25, 0.27, 0.29, 0.3, etc.; or, the material of the interdigital electrode 1 is Pt, and the thickness-to-wavelength ratio of the interdigital electrode 1 is 0.09-0.28, such as 0.09, 0.1, 0.11, 0.12, 0.13, 0.14, 0.15, 0.18, 0.2, 0.21, 0.22, 0.25, 0.27, 0.28, etc.

For example, when the material of the interdigital electrode 1 is Al and the thickness-to-wavelength ratio of the interdigital electrode 1 exceeds 0.17, the electromechanical coupling coefficient of the first-order horizontal shear wave mode of the dual-mode surface acoustic wave device exceeds 10%, the first-order horizontal shear wave mode is effectively excited; when the material of the interdigital electrode 1 is Cu and the thickness-to-wavelength ratio of the interdigital electrode 1 exceeds 0.12, the electromechanical coupling coefficient of the first-order horizontal shear wave mode of the dual-mode surface acoustic wave device exceeds 10%, the first-order horizontal shear wave mode is considered to be effectively excited. However, the thickness of the interdigital electrode 1 cannot infinitely increase, and a too-thick interdigital electrode 1 will lead to increase in loss. For example, when the material of the interdigital electrode 1 is Al and the thickness-to-wavelength ratio of the interdigital electrode 1 exceeds 0.28, the anti-resonance response of the first-order horizontal shear wave mode is deteriorated, so it is not suitable for use as a filter.

Specifically, the thickness h of the interdigital electrode 1 is 10 nm-5 μm, preferably 0.1 μm-4 μm, such as 10 nm, 30 nm, 50 nm, 0.1 μm, 0.6 μm, 1 μm, 2 μm, 3 μm, 4 μm, 5 μm, etc.; the width a of the interdigital electrode 1 is 0.1 μm-5 μm, preferably 0.2 μm-2 μm, such as 0.1 μm, 0.2 μm, 0.6 μm, 1 μm, 1.5 μm, 2 μm, 2.2 μm, 3 μm, 3.8 μm, 4 μm, 5 μm, etc.; the wavelength λ of the interdigital electrode 1 is 0.4 μm-20 μm, preferably 0.8 μm-8 μm, such as 0.4 μm, 0.5 μm, 0.8 μm, 1 μm, 1.5 μm, 2 μm, 2.2 μm, 3 μm, 3.8 μm, 4 μm, 5 μm, 6 μm, 8 μm, 10 μm, 13 μm, 15 μm, 19 μm, 20 μm, etc.

Specifically, the piezoelectric layer 2 comprises a rotating Y-cut LiTaO$_3$ single crystal film or a rotating Y-cut LiNbO$_3$ single crystal film, and the piezoelectric layer 2 has the thickness of 0.2 μm-5 μm and the surface roughness of less than 1 nm.

Specifically, the substrate 5 is a single crystal support substrate, specifically, it is a high-sound-velocity non-piezoelectric support substrate, and the transverse wave sound velocity of the substrate 5 is more than 4200 m/s; for example, the single crystal support substrate comprises any one of a quartz underlying substrate, a silicon underlying substrate, a sapphire underlying substrate, a diamond underlying substrate and a silicon carbide underlying substrate, and the thickness of the substrate 5 is 200 μm-1000 μm.

In one particular embodiment, a buffer layer 2 is also arranged between the interdigital electrode 1 and the piezoelectric layer 2, the material of the buffer layer comprises at least one of titanium, nickel, chromium and zirconium, but is not limited thereto, and the thickness of the buffer layer is 1 nm-20 nm.

In another particular embodiment, the dual-mode surface acoustic wave device can also comprise at least one functional layer which is arranged between the piezoelectric layer 2 and the substrate 5. The material of the functional layer comprises at least one of silicon oxide, aluminum oxide, aluminum nitride, silicon nitride, hafnium oxide, zirconium oxide, titanium oxide and polycrystalline silicon, but is not limited thereto; the thickness of the functional layer is 0.1 µm-10 µm, preferably 0.1 µm-1 µm. As a typical embodiment, the dual-mode surface acoustic wave device comprises at least two functional layers which are successively stacked, and the materials of the at least two functional layers are different.

Example 1

Figure 2:
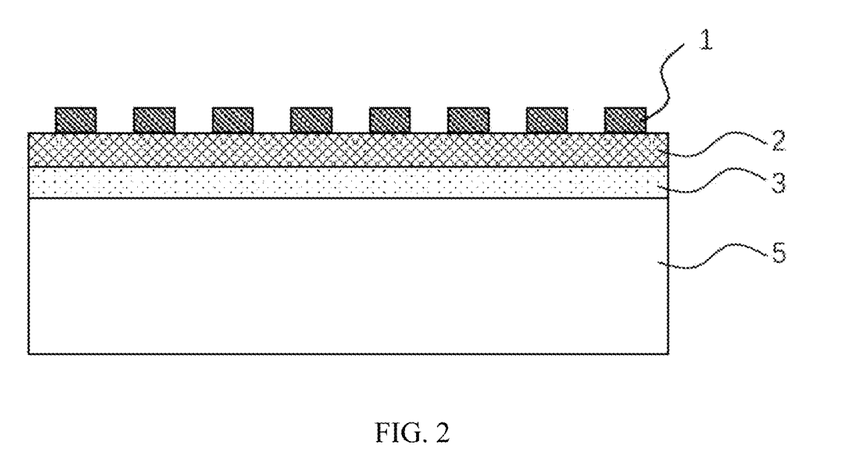
FIG. 2 is another structural diagram of a dual-mode surface acoustic wave device provided in the present disclosure.

Referring to FIG. 2, which is a cross-sectional view of a large-bandwidth dual-mode surface acoustic wave filter based on a 32°YX—LiNbO$_3$/SiO$_2$/SiC structure (a part of interdigital electrode is only contained in the figure). The large-bandwidth dual-mode surface acoustic wave filter comprises a substrate 5, a first functional layer 3, a piezoelectric layer 2 and an interdigital electrode 1 which are successively arranged in a selected direction.

As shown in FIG. 2, the piezoelectric layer 2 is a 32° YX—LiNbO$_3$ film, the thickness of the piezoelectric layer 2 is 300 nm, the first functional layer 3 is a SiO$_2$ film, and the thickness of the first functional layer 3 is 200 nm; the substrate 5 is a SiC substrate.

Figure 3:
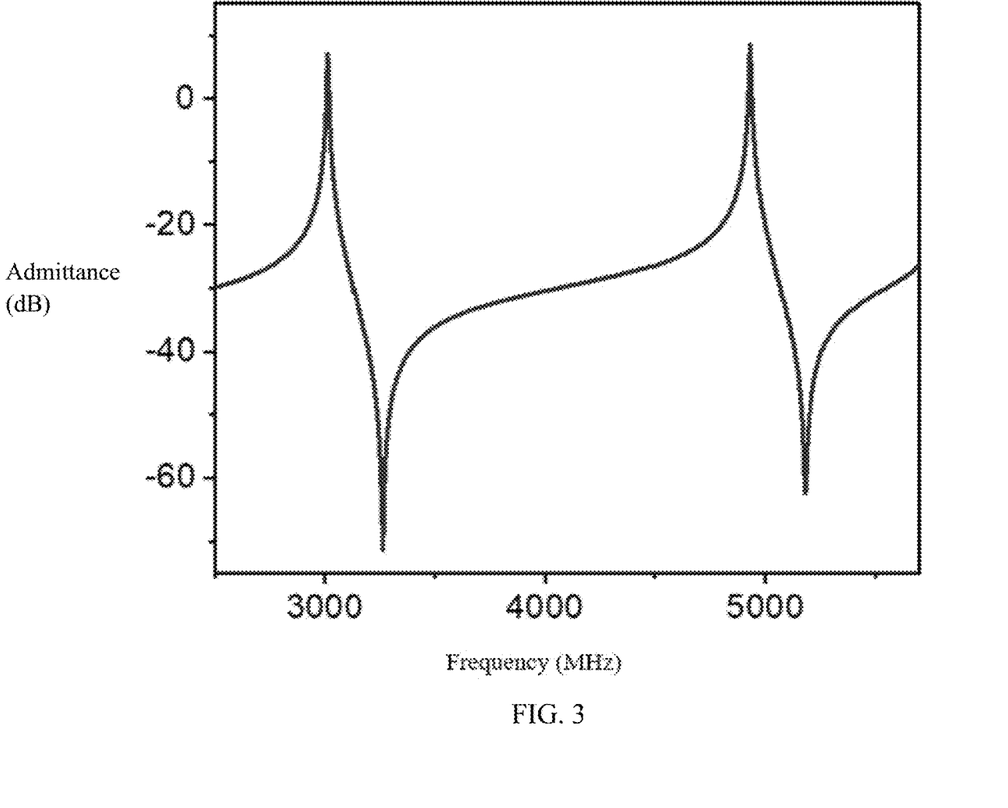
FIG. 3 is a simulated admittance graph of a large-bandwidth dual-mode surface acoustic wave filter provided in example 1 of the present disclosure.
Figure 4:
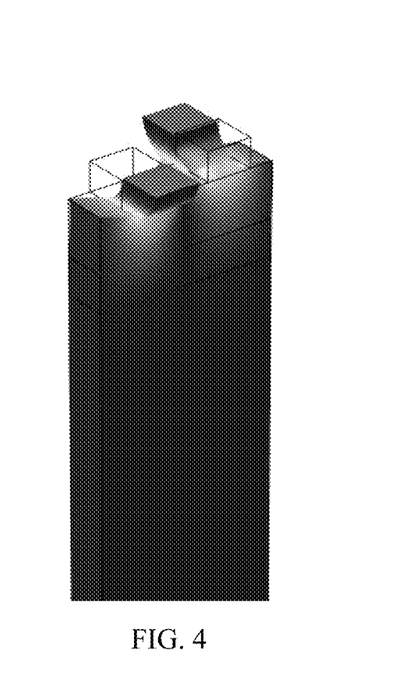
FIG. 4 is a mode shape graph of an SH0 mode of a large-bandwidth dual-mode surface acoustic wave filter provided in example 1 of the present disclosure.
Figure 5:
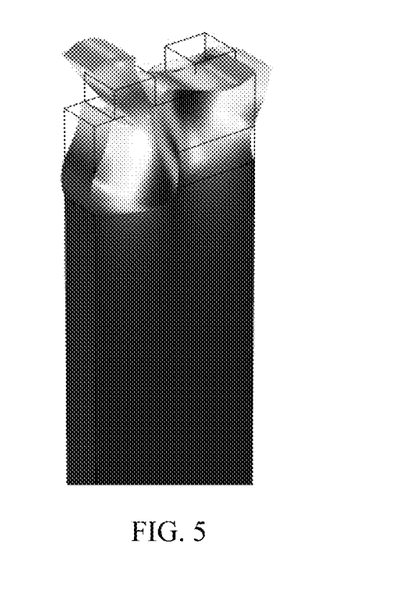
FIG. 5 is a mode shape graph of an SH1 mode of a large-bandwidth dual-mode surface acoustic wave filter provided in example 1 of the present disclosure.

The dual-mode surface acoustic wave device provided in this example is tested to obtain the following results:

When the material of the interdigital electrode 1 is Al, the thickness of the interdigital electrode 1 is h=180 nm. When the wavelength is λ=1 µm, the admittance curve of the single end resonator obtained by simulation in this example is as shown in FIG. 3. It can be seen from FIG. 3 that the dual-mode surface acoustic wave device can excite two acoustic wave modes, and the resonance frequencies $f_s$ of the two resonances are respectively 3010 MHz and 4930 MHz; the two acoustic wave modes are respectively an SH0 mode and an SH2 mode whose vibration mode diagrams are as shown in FIG. 4 and FIG. 5 respectively.

Figure 6:
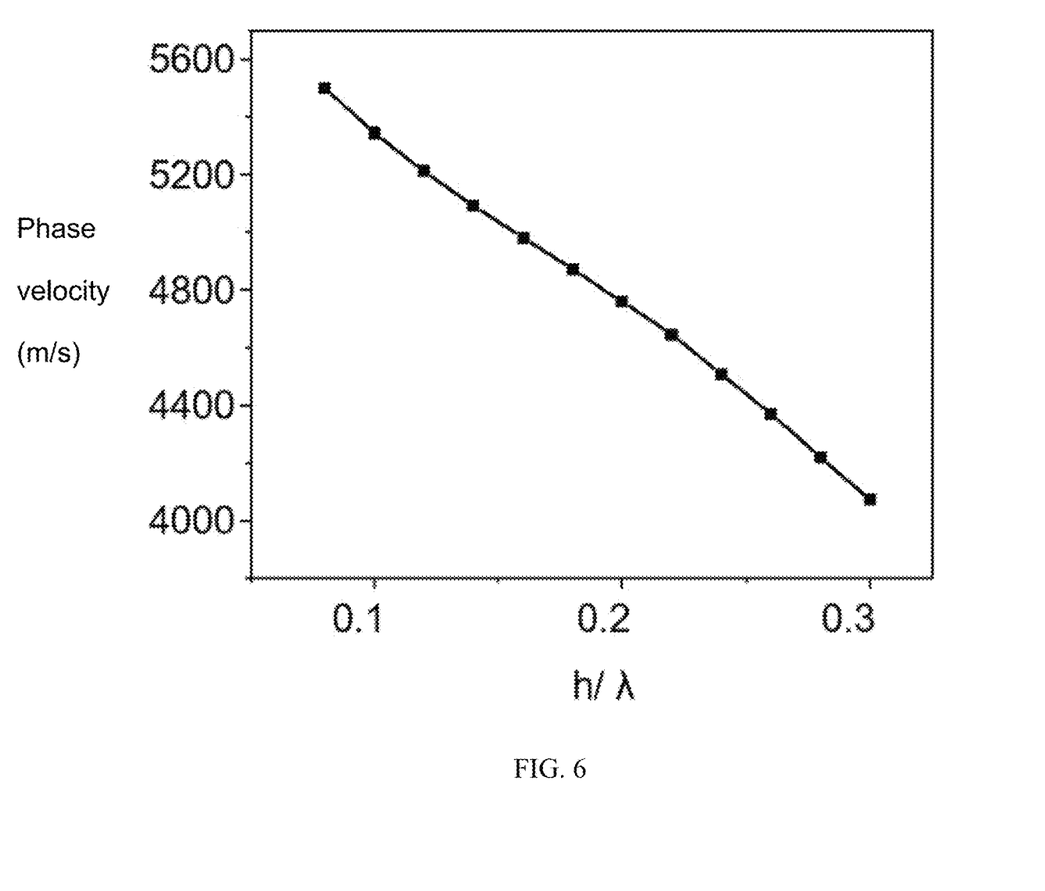
FIG. 6 shows a change trend of a sound velocity $v_p$ of an SH1 mode with a width-to-wavelength ratio of a Cu electrode in example 1 of the present disclosure.
Figure 7:
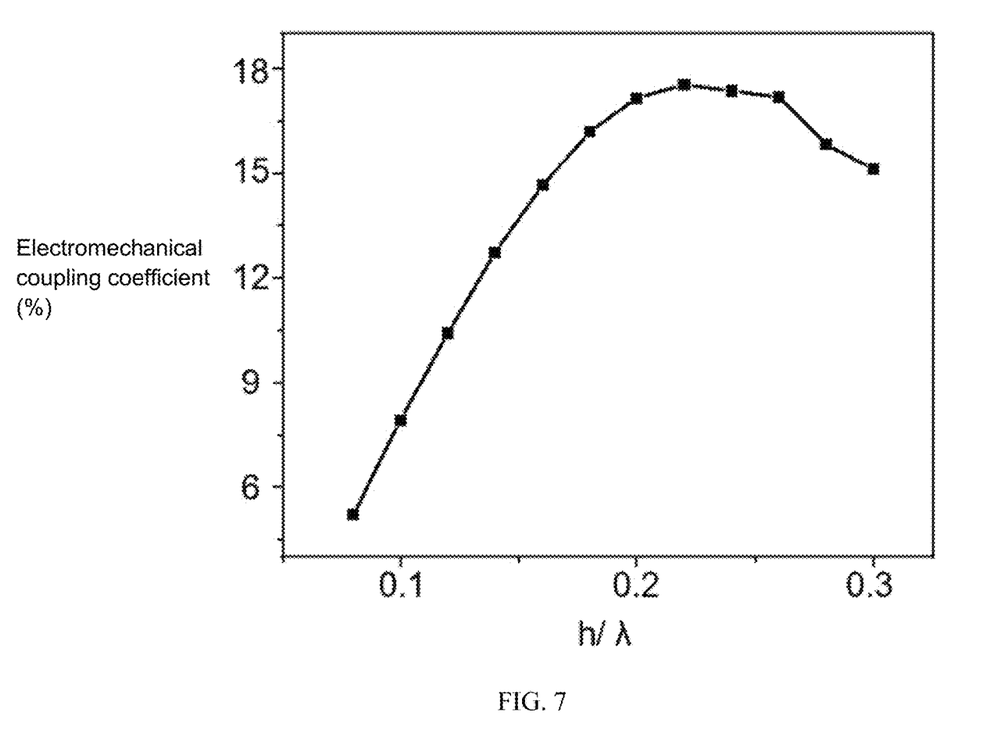
FIG. 7 shows a change trend of an electrochemical coupling coefficient $K^2$ of an SH1 mode with a width-to-wavelength ratio of a Cu electrode in example 1 of the present disclosure.

2) When the material of the interdigital electrode 1 is Cu and the wavelength is λ=1 µm, $v_p$ (phase velocity) and $K^2$ (electromechanical coupling coefficient) curves of the SH1 mode under different thickness-to-wavelength ratios h/λ of the same electrode are tested, as shown in FIG. 6 and FIG. 7. It can be seen from the figures that with the increase in the thickness of the Cu electrode, the $v_p$ of the SH1 mode gradually decreases, $K^2$ increases and then decreases, $K^2$ reaches a maximal value of 17.53% when the thickness-to-be wavelength ratio is h/λ=0.22.

Figure 8:
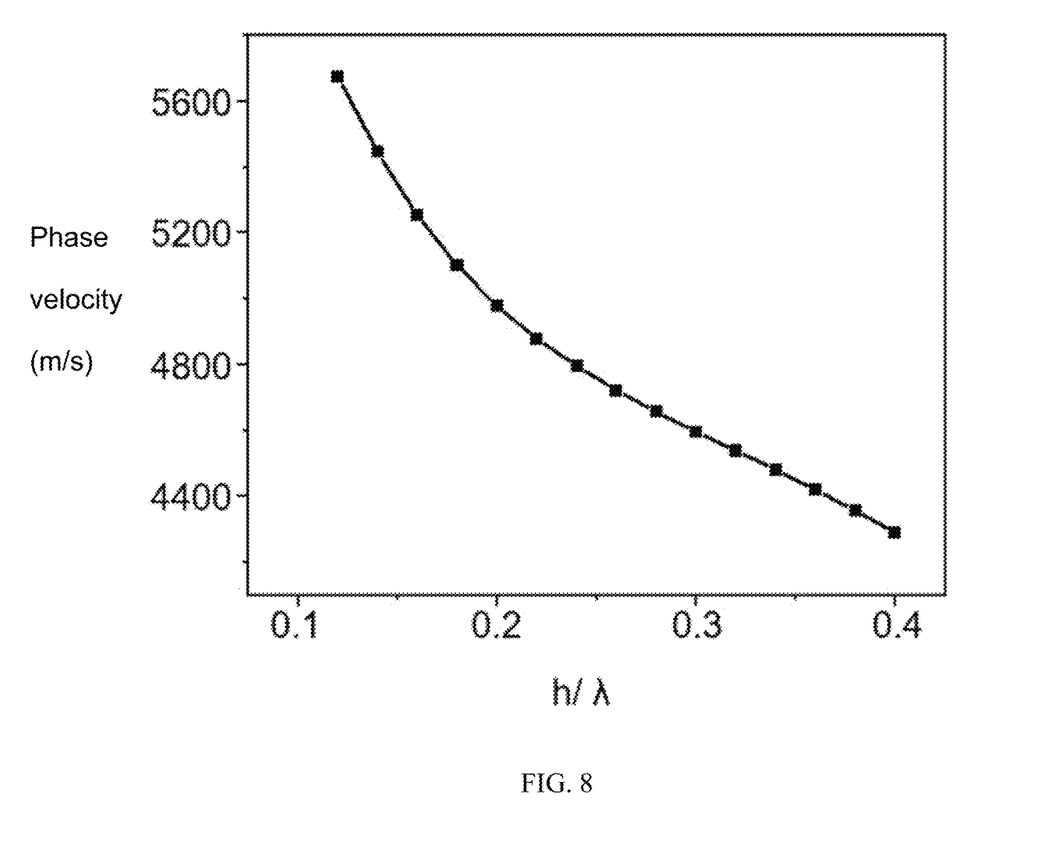
FIG. 8 shows a change trend of a sound velocity $v_p$ of an SH1 mode with a width-to-wavelength ratio of an Al electrode in example 1 of the present disclosure.
Figure 9:
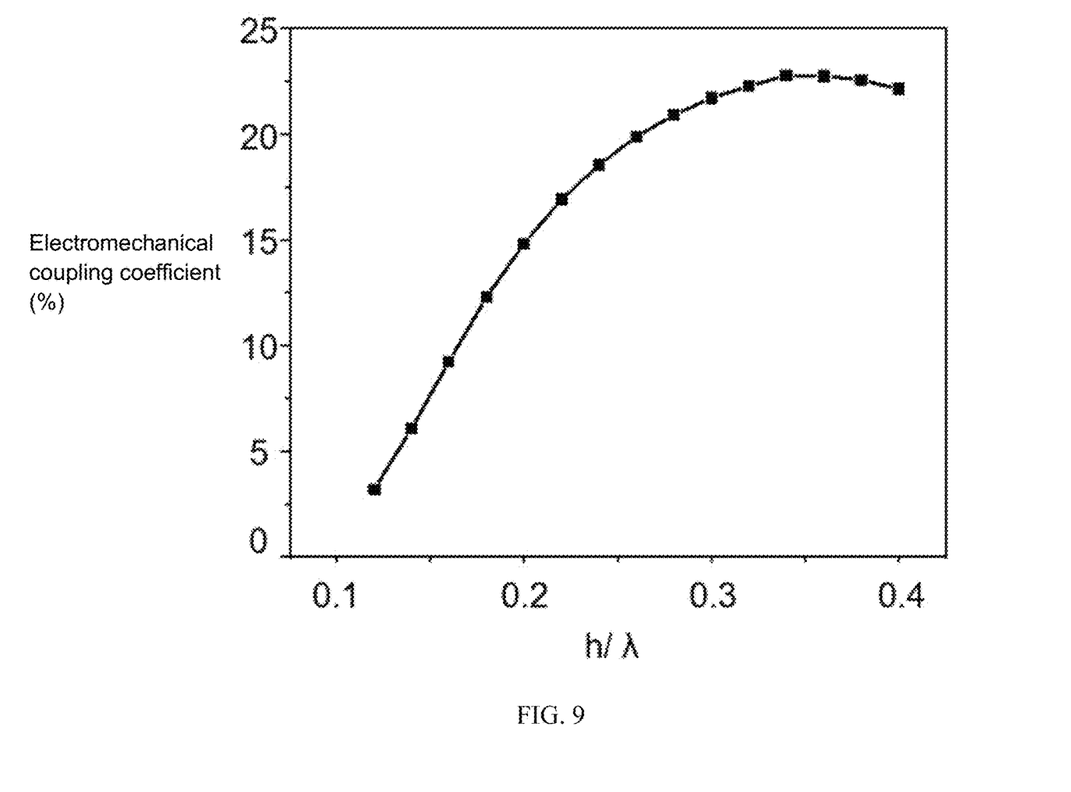
FIG. 9 shows a change trend of an electrochemical coupling coefficient $K^2$ of an SH1 mode with a width-to-wavelength ratio of an Al electrode in example 1 of the present disclosure.

3) When the material of the interdigital electrode is Al and the wavelength is λ=1 µm, $v_p$ (phase velocity) and $K^2$ (electromechanical coupling coefficient) curves of the SH1 mode under different thickness-to-wavelength ratios h/λ of the different electrodes are tested, as shown in FIG. 8 and FIG. 9. It can be seen from the figures that with the increase in the thickness of the Al electrode, the $v_p$ of the SH1 mode gradually decreases, $K^2$ increases and then decreases, and $K^2$ reaches a maximal value of 22.76% when the thickness-to-be wavelength ratio is h/λ=0.34.

Figure 10:
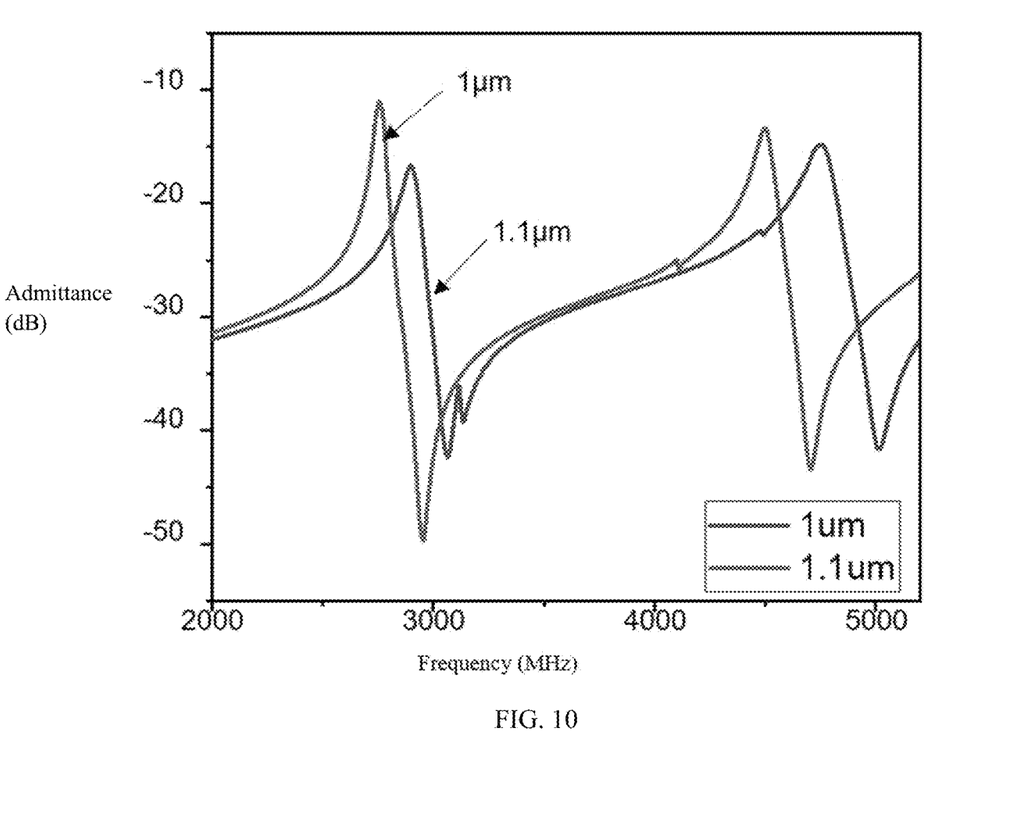
FIG. 10 shows admittance curve test results of large-bandwidth dual-mode surface acoustic wave filter when a material of an interdigital electrode is Al, the thickness of the interdigital electrode is 200 nm and the wavelengths of the interdigital electrode are 1 μm and 1.1 μm.

4) When the material of the interdigital electrode is Al and the thickness is 200 nm and when the wavelengths of the interdigital electrode 1 are 1 µm and 1.1 µm, the admittance curve diagram as shown in FIG. 10 is measured. In the admittance curve diagram, two dual-mode resonator signals without spurious modes are described, in which a red line is an admittance curve diagram corresponding to the interdigital electrode 1 with a wavelength of 1 µm, and a black line is an admittance curve diagram corresponding to the interdigital electrode 1 with a wavelength of 1.1 µm.

Figure 11:
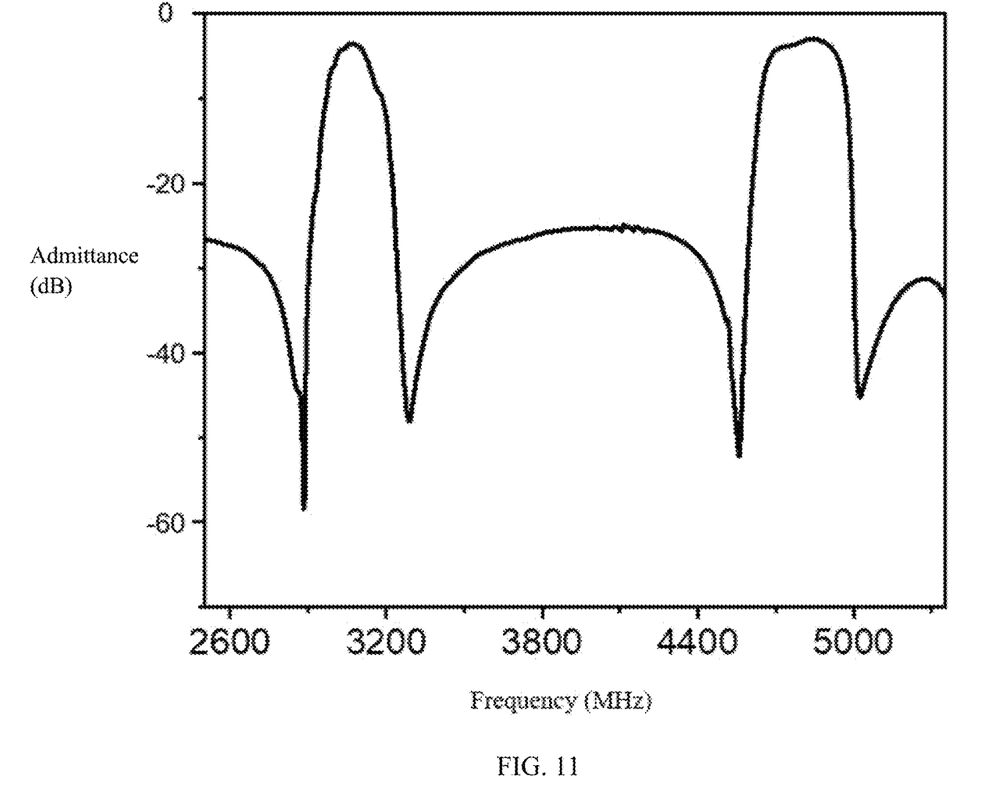
FIG. 11 shows S21 curve test results of large-bandwidth dual-mode surface acoustic wave filter when a material of an interdigital electrode is Al and the thickness of the interdigital electrode is 200 nm.

5) When the material of the interdigital electrode is Al and the thickness is 200 nm, FIG. 11 is an S21 curve graph of a dual-mode filter, the center frequency $f_c$ of the low-frequency passband is 3065.0 MHZ, the insertion loss is 3.46 dB, and the 3-dB bandwidth is 5.1%; the center frequency $f_c$ of the high-frequency passband is 4808.4 MHZ, the insertion loss is 2.92 dB, and the 3-dB bandwidth is 5.9%.

The existing dual-channel SAW filter is generally a parallel structure of two filters. The dual-mode surface acoustic wave device provided in this example achieves dual-channel signals in a trapezoidal filter, which is beneficial for reduction in use area.

Based on the large-bandwidth dual-mode surface acoustic wave device with the 32°YX-LiNbO$_3$/SiO$_2$/SiC structure in the above example, the present disclosure also provides a preparation process of the dual-mode surface acoustic wave device, which is specifically as follows:

1) Standard washing was performed on a piezoelectric layer and a SiC substrate.

The piezoelectric layer was a 4-inch 32° Y-cut LiNbO$_3$ piezoelectric layer, and the thickness of the LiNbO$_3$ piezoelectric wafer was 300 µm; the thickness of the SiC substrate was 500 µm.

2) A silicon dioxide film with a thickness of 200 nm as a first functional layer was prepared on the SiC substrate using a radio frequency magnetron sputtering method.

Sputtering was performed by using a silicon dioxide target under a back bottom vacuum degree of less than 9×10$^{-5}$ Pa at room temperature to sediment a silicon dioxide film, the flows of Ar and O$_2$ were respectively controlled to 18 sccm and 6 sccm, the coating pressure was 0.5 Pa, the power was 300 w, and the time was 40 min.

3) Ion implantation was performed on the washed 4-inch 32° Y-cut LiNbO$_3$ piezoelectric wafer to form an ion implantation layer inside the 32° Y-cut LiNbO$_3$ piezoelectric wafer, wherein the ion implantation temperature was 200° C., the ion implantation energy was 75 keV, and the implantation dose was 9×10$^{16}$ cm$^{-1}$.

4) The SiC substrate growing with the silicon dioxide film was bonded to the ion implantation surface of the LiNbO$_3$ piezoelectric wafer to form a composite underlying substrate, wherein the bonding temperature was 200° C., and the bonding pressure was 500 kg.

5) The composite underlying substrate was annealed, wherein the annealing temperature was 170° C., and the annealing time was 3 h, LiNbO$_3$ was stripped along the ion implantation layer, then the LiNbO$_3$ piezoelectric wafer in the stripped composite underlying substrate was thinned and wore down by using a chemical mechanical polishing method, until the LiNbO$_3$ piezoelectric wafer was thinned to 300 nm.

6) An interdigital electrode mask pattern was prepared on the surface of the LiNbO$_3$ piezoelectric wafer after worn down by using a photoetching method, an Al film with a thickness of 200 nm was prepared based on the interdigital electrode mask pattern by using an ion beam evaporation method, and then the interdigital electrode mask pattern was stripped to obtain an Al interdigital electrode.

The preparation method of the dual-mode surface acoustic wave device provided in the present disclosure is small in process difficulty, the rotating Y-cut LiTaO$_3$ or LiNbO$_3$ single crystal film was combined with the substrate (referred to as a high-sound-velocity non-piezoelectric support substrate) by utilizing the bonding process to form the composite underlying substrate, thereby inhibiting the leakage of the leaky surface acoustic wave and promoting the acoustic wave energy limiting effect of the substrate, so that main resonance is transformed into a non-leaky SH0 mode, and the electromechanical coefficient can be up to more than 15%.

Example 2

Figure 12:
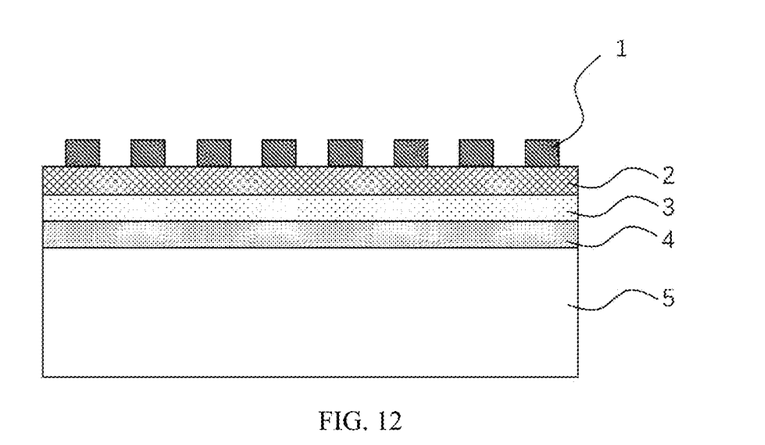
FIG. 12 is a structural diagram of another dual-mode surface acoustic wave device provided in the present disclosure.

Referring to FIG. 12, the structure of a large-bandwidth dual-mode surface acoustic wave filter based on a 32° YX—LiNbO$_3$/SiO$_2$/SiC structure in this example is basically the same as that in example 1 except that the large-bandwidth dual-mode surface acoustic wave filter in this example also comprises a second functional layer 4.

A first functional layer 3 is a silicon dioxide film which can promote the temperature stability of the device and reduce temperature drift; the second functional layer 4 is a polycrystalline silicon film which can increase the effective resistance of the substrate and improve the Q value of the device, or the first functional layer 3 is the silicon dioxide film, the second functional layer 4 is an aluminum nitride film, the characteristics that silicon dioxide is low in acoustic velocity and the aluminum nitride is high in acoustic velocity allow the first functional layer and the second functional layer to form a waveguide structure, thereby further promoting the acoustic energy limiting effect of the device and reducing the energy loss of the device; furthermore, the functional layer cannot damage the filtering function of the device, and has the effects of promoting the general performance of the surface acoustic wave device, achieving the reduction in temperature drift, improving the Q value, reducing the insertion loss and the like.

The present disclosure provides a dual-mode surface acoustic wave device. By utilizing the tangents rich in the rotating Y-cut LiTaO$_3$ or LiNbO$_3$ single crystal film and acoustic wave modes contained, the thickness-to-wavelength ratio is regulated by using a method of increasing the thickness of the interdigital electrode to enhance the excited SH1 mode which forms a dual-mode surface acoustic wave resonator and a filter together with the SH0 mode. Furthermore, the electromechanical coupling coefficients of the two acoustic wave modes are both large, the electromechanical coupling coefficient of the SH0 mode can be up to more than 15%, and the electromechanical coupling coefficient of the SH1 mode can be up to more than 10%, so that the dual-mode surface acoustic wave device provided in the present disclosure can support the filtering of more frequency bands in 5G communication, and meets the development trend of miniaturization and broadband of the surface acoustic wave filter.

The relative film thickness of the traditional surface acoustic wave resonator is generally about 8%. In the present disclosure, the excitation of the SH1 mode is enhanced by increasing the relative film thickness of the interdigital electrode, its electromechanical coupling coefficient and impedance ratio significantly increase, at this moment, the performance of the main resonance SH0 mode still can maintain a relatively high level, and the two acoustic wave modes can constitute the dual-mode filter.

In addition, for the dual-mode surface acoustic wave device provided in the present disclosure, 1-2 functional layers can also be arranged between the piezoelectric layer and the substrate, for example, the addition of silicon dioxide functional layer alone can promote the temperature stability of the device, and reduce the temperature drift; the addition of the polycrystal silicon functional layer alone can increase the effective resistance of the substrate and improve the Q value of the device; when the silicon dioxide functional layer and the aluminum functional layer are simultaneously added, the characteristics that silicon dioxide is low in acoustic velocity and the aluminum nitride is high in acoustic velocity can form a waveguide structure, thereby further promoting the acoustic energy limiting effect of the device and reducing the energy loss of the device; furthermore, the functional layer not only cannot damage the filtering of the device, but also can promote the comprehensive performance of the surface acoustic wave device, achieves the reduction in temperature drift, improves the Q value, reduces the insertion loss, and the like.

It should be understood that the above embodiments are only for illustrating the technical concept and features of the present disclosure for the purpose of making those skilled in the art know the contents of the present disclosure and implement the present disclosure, but not thereby limiting the protective scope of the present disclosure. Equivalent changes or modifications made according to the spirit of the present disclosure shall be included within the protective scope of the present disclosure.

What is claimed is:

1. A dual-mode surface acoustic wave device, comprising a substrate, a piezoelectric layer and an interdigital electrode, wherein the substrate, the piezoelectric layer and the interdigital electrode are successively stacked in a selected direction, wherein a thickness of the interdigital electrode is 10 nm-5 μm and a thickness-to-wavelength ratio of the interdigital electrode is 0.09-0.4 to excite a first-order horizontal shear wave mode, wherein the dual-mode surface acoustic wave device has two acoustic wave modes comprising a ground state horizontal shear wave mode and the first-order horizontal shear wave mode, and the dual-mode surface acoustic wave device further comprises at least one functional layer, wherein the at least one functional layer is arranged between the piezoelectric layer and the substrate, an electromechanical coupling coefficient of a ground state horizontal shear wave of the dual-mode surface acoustic wave device is more than 15%, and an electromechanical coupling coefficient of a first-order horizontal shear wave of the dual-mode surface acoustic wave device is more than 10%.

2. The dual-mode surface acoustic wave device according to claim 1, wherein a wavelength of the interdigital electrode is 0.4 μm-20 μm.

3. The dual-mode surface acoustic wave device according to claim 2, wherein a material of the interdigital electrode is a metal with a density of more than 2700 kg/m$^3$.

4. The dual-mode surface acoustic wave device according to claim 1, wherein a width of the interdigital electrode is 0.1 μm-5 μm.

5. The dual-mode surface acoustic wave device according to claim 1, wherein a material of the interdigital electrode is a metal with a density of more than 2700 kg/m$^3$.

6. The dual-mode surface acoustic wave device according to claim 5, wherein the material of the interdigital electrode is Al, and the thickness-to-wavelength ratio of the interdigital electrode is 0.17-0.4; or the material of the interdigital electrode is Cu, and the thickness-to-wavelength ratio of the interdigital electrode is 0.12-0.3; or the material of the interdigital electrode is Mo, and the thickness-to-wavelength ratio of the interdigital electrode is 0.2-0.3; or the material of the interdigital electrode is W, and the thickness-to-wavelength ratio of the interdigital electrode is 0.15-0.3; or the material of the interdigital electrode is Pt, and the thickness-to-wavelength ratio of the interdigital electrode is 0.09-0.28.

7. The dual-mode surface acoustic wave device according to claim 1, wherein a material of the at least one functional layer comprises at least one of silicon oxide, aluminum oxide, aluminum nitride, silicon nitride, hafnium oxide, zirconium oxide, titanium oxide and polycrystalline silicon.

8. The dual-mode surface acoustic wave device according to claim 7, wherein the dual-mode surface acoustic wave device comprises at least two functional layers, wherein the at least two functional layers are successively stacked, and materials of the at least two functional layers are different.

9. The dual-mode surface acoustic wave device according to claim 1, wherein a thickness of the at least one functional layer is 0.1 μm-10 μm.

10. The dual-mode surface acoustic wave device according to claim 1, wherein the piezoelectric layer comprises a rotating Y-cut $LiTaO_3$ single crystal film or a rotating Y-cut $LiNbO_3$ single crystal film.

11. The dual-mode surface acoustic wave device according to claim 10, wherein a thickness of the piezoelectric layer is 0.2 μm-5 μm.

12. The dual-mode surface acoustic wave device according to claim 10, wherein a surface roughness of the piezoelectric layer is less than 1 nm.

13. The dual-mode surface acoustic wave device according to claim 1, wherein the substrate is a single crystal support substrate.

14. The dual-mode surface acoustic wave device according to claim 1, wherein a transverse wave sound velocity of the substrate is more than 4200 m/s.

15. The dual-mode surface acoustic wave device according to claim 1, wherein the substrate comprises any one of a quartz underlying substrate, a silicon underlying substrate, a sapphire underlying substrate, a diamond underlying substrate and a silicon carbide underlying substrate.

16. The dual-mode surface acoustic wave device according to claim 1, wherein a thickness of the substrate is 200 μm-1000 μm.

17. The dual-mode surface acoustic wave device according to claim 1, wherein a buffer layer is further arranged between the interdigital electrode and the piezoelectric layer, and a material of the buffer layer comprises at least one of titanium, nickel, chromium and zirconium.

18. The dual-mode surface acoustic wave device according to claim 17, wherein a thickness of the buffer layer is 1 nm-20 nm.

19. A preparation method of a dual-mode surface acoustic wave device, comprising:
providing a substrate;
successively preparing a functional layer and a piezoelectric layer on the substrate; and
preparing an interdigital electrode on the piezoelectric layer;
wherein a thickness of the interdigital electrode is 10 nm-5 μm and a thickness-to-wavelength ratio of the interdigital electrode is 0.09-0.4 to excite a first-order horizontal shear wave mode, wherein the dual-mode surface acoustic wave device has two acoustic wave modes comprising a ground state horizontal shear wave mode and the first-order horizontal shear wave mode, an electromechanical coupling coefficient of a ground state horizontal shear wave of the dual-mode surface acoustic wave device is more than 15%, and an electromechanical coupling coefficient of a first-order horizontal shear wave of the dual-mode surface acoustic wave device is more than 10%.

20. The preparation method of the dual-mode surface acoustic wave device according to claim 19, wherein a wavelength of the interdigital electrode is 0.4 μm-20 μm.

* * * * *